United States Patent
Stirton et al.

(10) Patent No.: US 6,790,570 B1
(45) Date of Patent: Sep. 14, 2004

(54) METHOD OF USING SCATTEROMETRY MEASUREMENTS TO CONTROL STEPPER PROCESS PARAMETERS

(75) Inventors: James Broc Stirton, Austin, TX (US); Richard D. Edwards, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 537 days.

(21) Appl. No.: 10/005,486

(22) Filed: Nov. 8, 2001

(51) Int. Cl.$^7$ .................................................. G03F 9/00
(52) U.S. Cl. ...................... 430/30; 356/369; 356/445; 356/448; 382/145; 382/149
(58) Field of Search .......................... 430/30; 356/357, 356/369, 445, 448; 382/145, 149

(56) References Cited

U.S. PATENT DOCUMENTS

| | | | |
|---|---|---|---|
| 5,867,276 A | 2/1999 | McNeil et al. | 356/445 |
| 5,880,838 A | 3/1999 | Marx et al. | 356/351 |
| 6,051,348 A | 4/2000 | Marinaro et al. | 430/30 |
| 6,081,334 A | 6/2000 | Grimbergen et al. | 356/357 |
| 6,245,584 B1 | 6/2001 | Marinaro et al. | 438/14 |
| 6,433,878 B1 | 8/2002 | Niu et al. | 356/603 |
| 2002/0135781 A1 | 9/2002 | Singh et al. | 356/601 |

*Primary Examiner*—Christopher G. Young
(74) *Attorney, Agent, or Firm*—Williams, Morgan & Amerson, P.C.

(57) ABSTRACT

A method of using scatterometric techniques to control stepper process is disclosed. In one illustrative embodiment, the method comprises providing a library of optical characteristic traces, each of which corresponds to a grating structure comprised of a plurality of features having a known profile, and forming a plurality of grating structures in a layer of photoresist, each of said formed grating structures being comprised of a plurality of features having an unknown profile. The method further comprises illuminating the formed grating structures, measuring light reflected off of each of the formed grating structures to generate an optical characteristic trace for each of the formed grating structures, comparing each of said generated optical characteristic traces to at least one optical characteristic trace from the library, and modifying at least one parameter of a stepper exposure process to be performed on at least one subsequently processed wafer based upon the comparison of the generated optical characteristic traces and the optical characteristic trace from the library. In another embodiment, the generated optical characteristic traces for the grating structures are compared to a target optical characteristic trace for the grating structures, and at least one parameter of an exposure process to be performed on a layer of photoresist formed on a subsequently processed wafer may be determined or modified based upon this comparison.

98 Claims, 7 Drawing Sheets

US 6,790,570 B1

METHOD OF USING SCATTEROMETRY MEASUREMENTS TO CONTROL STEPPER PROCESS PARAMETERS

BACKGROUND OF THE INVENTION

1. Field of the Invention

This invention relates generally to semiconductor fabrication technology, and, more particularly, to a method of using scatterometry measurements to control stepper process parameters, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, ie., the width of the gate electrode 14, that approximately corresponds to the channel length 13 of the device when the transistor 10 is operational. Of course, the critical dimension 12 of the gate electrode 14 is but one example of a feature that must be formed very accurately in modem semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a patterned layer of photoresist above one or more layers of material that are desired to be patterned, and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

FIGS. 2 and 3 depict an illustrative embodiment of a wafer 11 that may be subjected to an exposure process in a stepper tool. In general, the stepper exposure process is performed on a stack comprised of one or more process layers or films and a layer of photoresist. For example, as shown in FIG. 2, such a stack may be comprised of a layer of polysilicon 36, formed above the substrate 11, and a layer of photoresist 38. Alternatively, an anti-reflective coating (ARC) layer (not shown) may be positioned above the layer of polysilicon 36 and below the layer of photoresist 38. Of course, such film stacks may be comprised of a vast variety of combinations of process layers and materials.

As shown in FIG. 3, a plurality of die 42 are formed above the wafer 11. The die 42 define the area of the wafer 11 where production integrated circuit devices, e.g., microprocessors, ASIC, memory devices, will be formed. The size, shape and number of die 42 per wafer 11 depend upon the type of device under construction. For example, several hundred die 42 may be formed above an 8-inch diameter wafer 11. The wafer 11 may also have an alignment notch 17 that is used to provide relatively rough alignment of the wafer 11 prior to performing certain processes, e.g., an exposure process in a stepper tool.

As shown in FIG. 2, the stepper tool contains a representative light source 47 that is used to project light through a reticle (not shown) onto a layer of photoresist 38. Ultimately, the image in the reticle will be transferred to the layer of photoresist 38, and the underlying process layer 36 will be patterned using the patterned layer of photoresist 38 as a mask during one or more subsequent etching processes.

The exposure process performed on the wafer 11 is typically performed on a flash-by-flash basis as the wafer 11 is moved, or stepped, relative to the light source 47. During each step, the light source 47 projects light onto a given area of the wafer 11, i.e., each flash is projected onto an exposure field 41. The size of the exposure field 41, as well as the number of die 42 within each exposure field 41, may vary greatly. For example, an illustrative exposure field 41 is depicted in FIG. 3 wherein four of the die 42 fall within the exposure field 41, i.e., a so-called 2×2 pattern. However, the number of die 42 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

One parameter of the stepper exposure process that is of critical importance is the location of the focal plane of the stepper. In general, the focal plane of the stepper is the point where the image plane and the object plane coincide. The location of the focal plane may vary based upon a variety of factors, e.g., the type of photoresist material used, the composition of the underlying process layers, the thickness of the layer of photoresist, etc. Ideally, the focal plane will be located at a position that produces acceptable DICD dimensions and profiles in the layer of photoresist 38. In the illustrative example depicted in FIG. 2, the focal plane of the stepper tool is located at the approximate middle of the layer of photoresist 38, as indicated by the lines 39. The focal plane may be located at the line 39 within the layer of photoresist 38, as indicated in FIG. 2, or it may be located at another point, i.e., at the surface 43 of the layer of photoresist 38. The location of the focal plane may vary greatly based upon a number of features, such as the type and thickness of the layer of photoresist 38, as well as the composition and thickness of the underlying process layers.

Due to a variety of reasons, the thickness of the layer of photoresist 38, as well as the position of its surface 43 relative to the light source 47, may vary across the wafer 11 and among the various exposure fields 41. As a result, the ideal location of the focal plane for the stepper exposure process may vary among the exposure fields 41. For example, the layer of photoresist 38 within a particular exposure field 41 may be thinner than anticipated. As a result, the focal plane of the stepper may be positioned above the ideal location, thereby producing features in the layer of photoresist 38 in that exposure field 41 with rounded corners of a magnitude that are unacceptable. In turn, this may result in distortion of the features in the underlying process layer 36.

Normally, it is desirable that the surface 43 of the layer of photoresist 38 will be positioned approximately perpendicular to the incident light from the light source 47 during the exposure process. This is desired to reduce the magnitude of diffracted light from the light source. However, for a variety of reasons, the surface 43 of the layer of photoresist 38 may be tilted in one or more directions as indicated by the dashed line 43A and the angle 44. Accordingly, most modem stepper tools are provided with means for compensating for the tilt in the layer of photoresist 38, e.g., by adjusting the tilt of the reticle (not shown) and/or the tilt of the wafer 11, such that the approximately perpendicular relationship is maintained between the tilted surface 43 of the layer of photoresist 38 and the light from the light source 47. Variations in the tilt of the surface 43 of the layer of photoresist 38 may occur for a number of reasons, e.g., underlying topography, excessive spinning during the process of forming the layer of photoresist 38, variations in the temperature of the photoresist, variations in cool plate or oven temperatures, etc. Moreover, such tilt variations may be different in different exposure fields 41 of the wafer 11.

Variations that may occur during stepper exposure processes, such as variations in the location of the focal plane and the tilt of the surface 43 of the layer of photoresist 38, may result in the features formed in the patterned layer of photoresist 38 having undesirable characteristics. For example, if a layer of photoresist 38 is exposed with the focal plane located above the desired location of the focal plane, the features formed in the patterned layer of photoresist 38 will have rounded corners on top of the photoresist. As a result, features formed in the underlying process layer will exhibit similar characteristics. On the other hand, if the layer of photoresist 38 is exposed using a focal plane that is located below the desired location of the focal plane, the features in the underlying process layer 36 will tend to exhibit undercutting. Performing the exposure process in exposure fields 41 wherein the surface 43 of the layer of photoresist 38 is not substantially perpendicular to the light generated by the stepper tool, results in similar problems.

In turn, such problems may lead to excessive rework of the patterned layer of photoresist 38, ie., the incorrectly formed layer of photoresist 38 may have to be removed, and the process may have to be repeated. Even worse, if undetected, the variations in the patterned layer of photoresist 38 resulting from variations in the tilt angle and/or location of the focal plane of the exposure process may ultimately lead to the formation of features, e.g., gate electrodes, having dimensions that are not acceptable for the particular integrated circuit device under construction. For example, transistors may be produced with gate electrodes that are too wide (relative to a preestablished target value), thereby producing transistor devices that operate at less than desirable switching speeds. All of these problems result in delays, waste, excessive costs and cause reduced yields of the manufacturing operations.

The present invention is directed to a method and system that may solve, or at least reduce, some or all of the aforementioned problems.

SUMMARY OF THE INVENTION

The present invention is generally directed to a method of using scatterometry measurements to control stepper process parameters. In one illustrative embodiment, the method comprises providing a library of optical characteristic traces, each of which corresponds to a grating structure comprised of a plurality of features having a known profile, forming a plurality of grating structures in a layer of photoresist, each of the formed grating structures being comprised of a plurality of features having an unknown profile, and illuminating the formed grating structures. The method further comprises measuring light reflected off of each of the plurality of formed grating structures to generate an optical characteristic trace for each of the formed grating structures, comparing each of the generated optical characteristic traces to at least one optical characteristic trace from the library, and modifying at least one parameter of a stepper exposure process to be performed on at least one subsequently processed wafer based upon the comparison of the generated optical characteristic traces and the at least one optical characteristic trace from the library.

In another illustrative embodiment, the method comprises providing a wafer having at least one process layer and a layer of photoresist formed thereabove, forming a plurality of grating structures in the layer of photoresist, illuminating the grating structures, and measuring light reflected off of the grating structures to generate an optical characteristic trace for each of the grating structures. The method further comprises comparing the generated optical characteristic traces to a target optical characteristic trace, and determining, based upon a comparison of the generated optical characteristic traces and the target optical characteristic trace, at least one parameter of an exposure process to be performed on a layer of photoresist formed on a subsequently processed wafer. In other embodiments of the invention, at least three, at least five, or at least nine of the grating structures are formed in a layer of photoresist. In yet another embodiment, the invention comprises modifying at least one parameter of a stepper exposure process to be performed on a subsequently processed wafer based upon a deviation between the generated optical characteristic trace and the target optical characteristic trace.

BRIEF DESCRIPTION OF THE DRAWINGS

The invention may be understood by reference to the following description taken in conjunction with the accompanying drawings, in which like reference numerals identify like elements, and in which.

Figure 1:
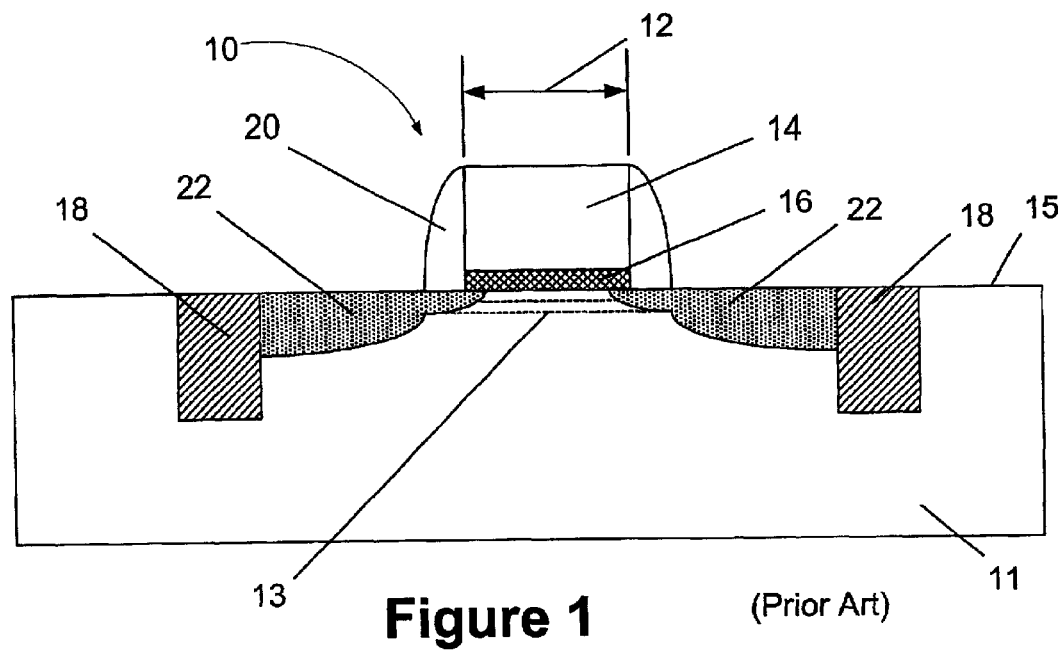
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of using scatterometry measurements to control stepper process parameters, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

More particularly, the photolithography process generally involves the steps of:

(1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Some aspects of the present invention will now be described with reference to FIGS. 4A–C and 5A–B. In general, the present invention involves the formation of a plurality of grating structures 60 in a layer of photoresist 38 within an exposure field 41 defined by a stepper exposure process, and, based upon scatterometric measurements of those grating structures 60, determining one or more parameters of a stepper exposure process to be performed on one or more subsequently processed wafers.

Figure 4A:
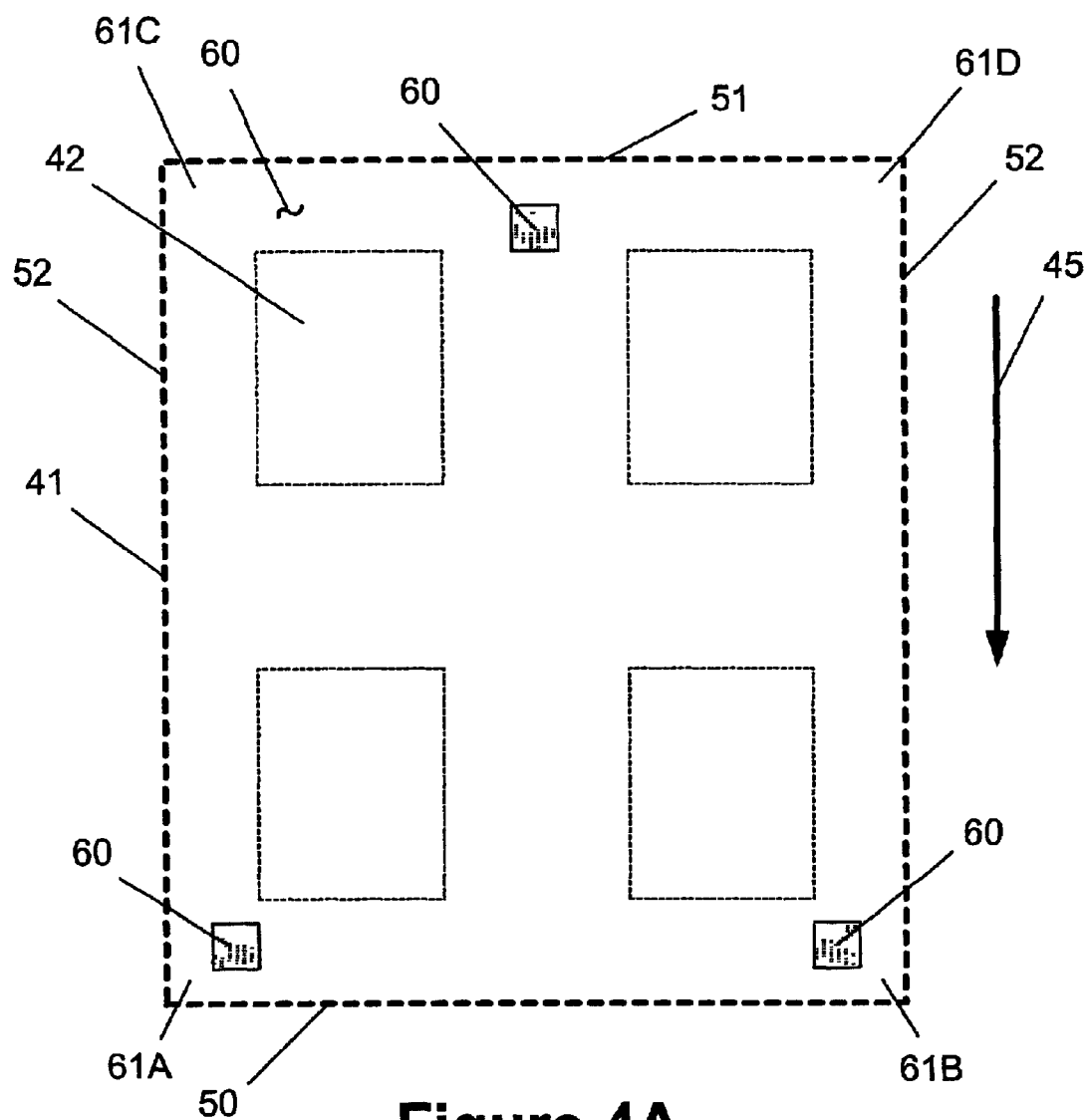
FIGS. 4A–C depict illustrative embodiments of the present invention wherein multiple grating structures are formed in a layer of photoresist.

FIG. 4A depicts an illustrative exposure field 41 of a stepper exposure process used to expose a layer of photoresist 38. The particular exposure field 41 depicted in FIG. 4A is defined by a bottom edge 50, a top edge 51, side edges 52 and four corners 61A–D. The depicted exposure field 41 encompasses four die 42 (indicated by dashed lines) formed above the wafer 11. Of course, the size and shape of the exposure field 41 may be varied as a matter of design choice. Also shown in FIG. 4A are a plurality of grating structures 60 that will be formed in the layer of photoresist 38. The grating structures 60 may be formed at the same time features are being formed in the layer of photoresist 38 that will ultimately be used to define various features in the underlying process layer 36 in the area defined by the underlying die 42. Ultimately, these grating structures 60 will be measured using scatterometric techniques, and these measurements will be used to determine, confirm and/or control one or more parameters of a stepper exposure process. Normally, these grating structures 60 will be formed in the layer of photoresist 38 above the space between the die 42, i.e., in the area defined by so-called scribe lines. The size of the scribe lines relative to the size of the die 42 in the attached figures is exaggerated for purposes of clarity. Alternatively, assuming there is available plot space, the grating structures 60 may be formed in the area defined by one or more of the die 42.

As will be recognized by those skilled in the art after a complete reading of the present application, the size, shape, location and configuration of the grating structures 60 formed in the layer of photoresist 38 may be varied as a matter of design choice. For example, in the embodiment depicted in FIG. 4A, only three grating structures 60 are formed in the layer of photoresist 38. Two of the grating structures 60 are positioned adjacent the bottom corners 61A, 61B of the exposure field 41, and one of the grating structures 60 is positioned adjacent the approximate middle of the top edge 51 of the exposure field 41.

Figure 4B:
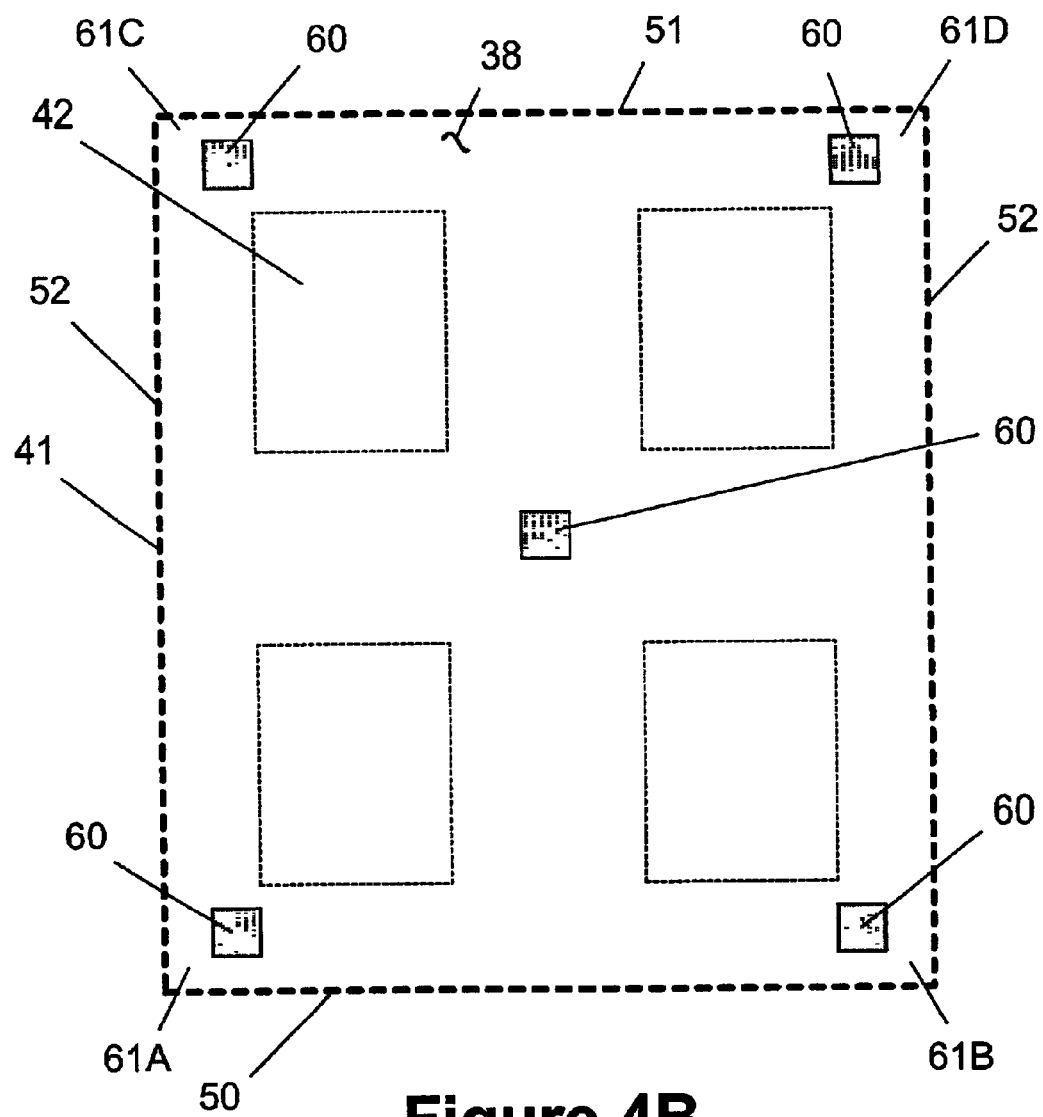
Figure 4C:
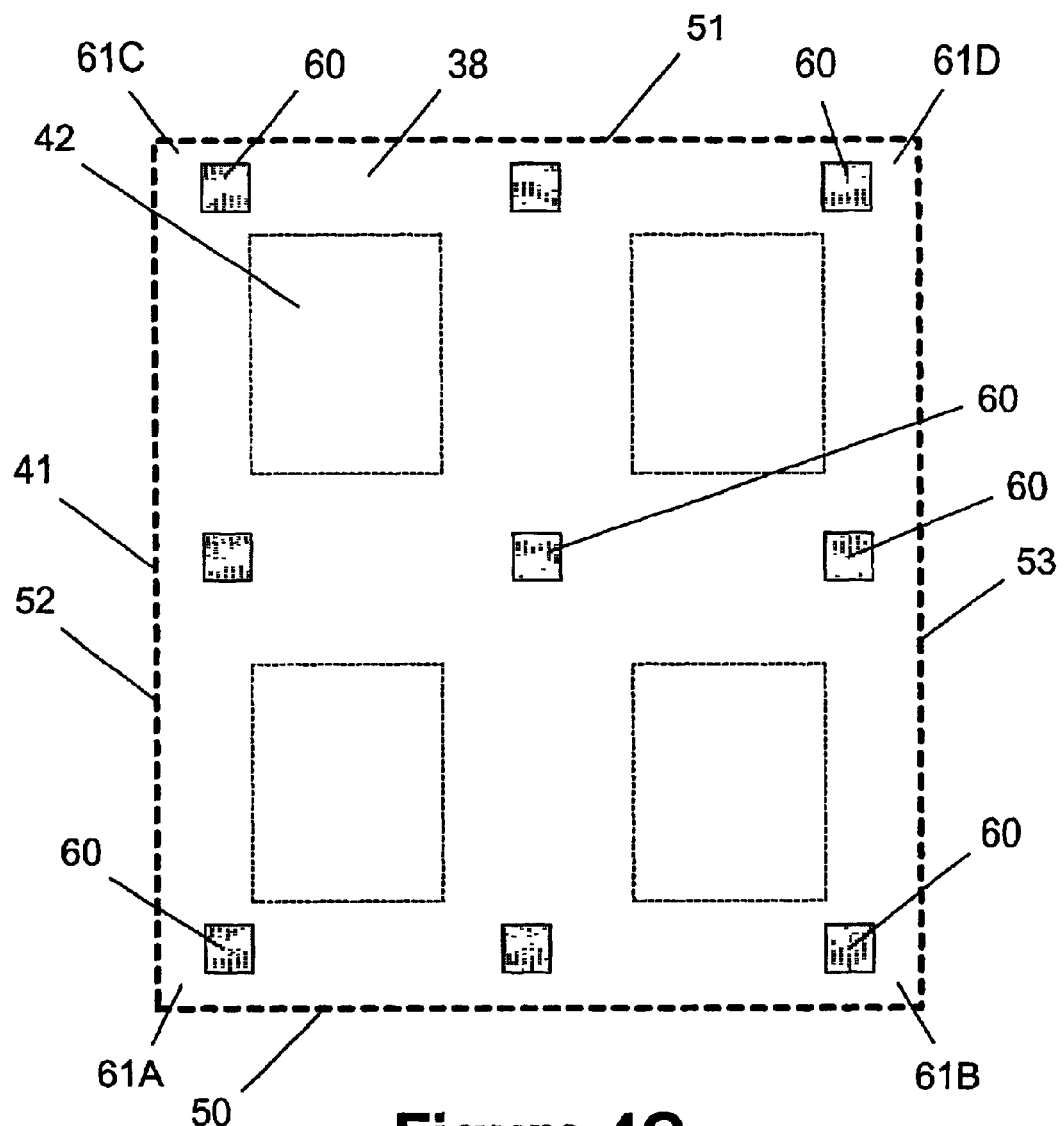

FIGS. 4B and 4C depict other illustrative embodiments of the present invention wherein a plurality of grating structures 60 are positioned at various locations within the exposure field 41. For example, in FIG. 4B, five grating structures 60 are formed in the exposure field 41. That is, a grating structure 60 is positioned adjacent each corner (61A–D) of the exposure field 41, and another grating structure 60 is positioned in the approximate middle of the exposure field 41. In FIG. 4C, nine of the grating structures 60 are formed in the layer of photoresist 38 within the exposure field 41. In this embodiment, three of the grating structures 60 are positioned proximate each of the top edge 51, the bottom edge 50, and each of the side edges 52, and one grating structure 60 is positioned in the approximate middle of the exposure field 41. That is, in the embodiment depicted in FIG. 4C, a plurality of the grating structures 60 are positioned around the perimeter of the exposure field 41, and one of the grating structures 60 is positioned in the approximate middle of the exposure field 41. Of course, as will be recognized by those skilled in the art after a complete reading of the present application, the number and arrangement of the grating structures 60 within the exposure field 41 may be varied as a matter of design choice.

Figure 5A:
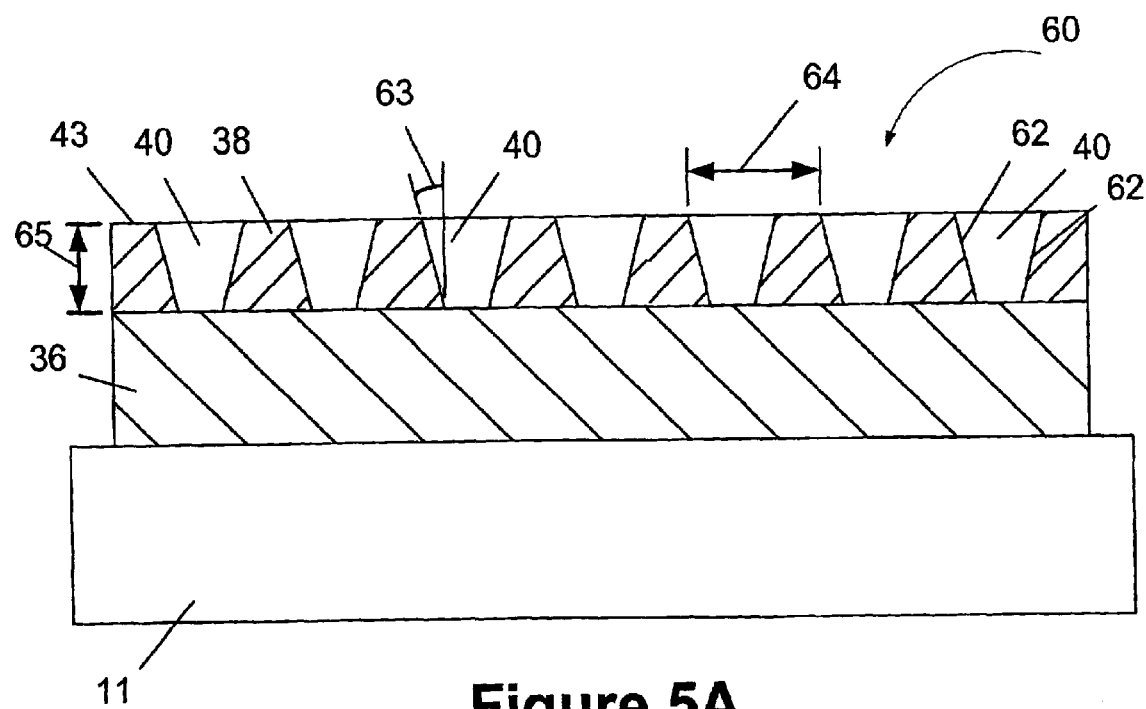
FIGS. 5A–B depict an illustrative grating structure that may be used with the present invention.
Figure 5B:
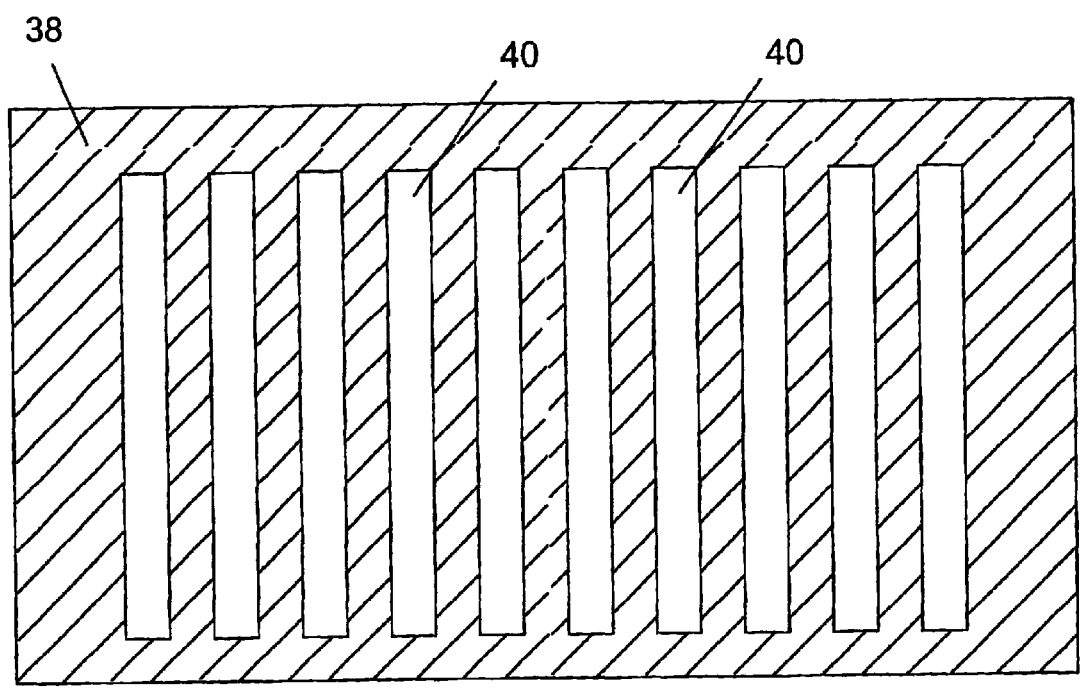

The size, shape, configuration and type of grating structure 60 may be varied as a matter of design choice. For example, the grating structure 60 may be comprised of multiple lines or trenches formed in the layer of photoresist 38. One such illustrative grating structure 60, depicted in FIGS. 5A–B, is comprised of a plurality of trenches 40 formed in the layer of photoresist 38. The trenches 40 comprising the grating structure 60 have a depth 65 and sidewalls 62 disposed at an angle 63 (relative to a line normal to the surface 43 of the layer of photoresist 38). The depth 65, the sidewall angle 63, and the spacing or pitch 64 between the trenches 40 may be varied as a matter of design choice. For example, the grating structure 60 may be formed in regions having approximate dimensions of 100 nm×120 nm, and it may be comprised of approximately 300–400 trenches 40 (depending upon the selected pitch).

Normally, the depth 65 of the trenches 40 will correspond to the thickness of the layer of photoresist 38. The sidewall angle 63 of the trenches 40 may vary from approximately 70–100 degrees, and, in some cases, from 85–90 degrees in normal production.

Figure 6:
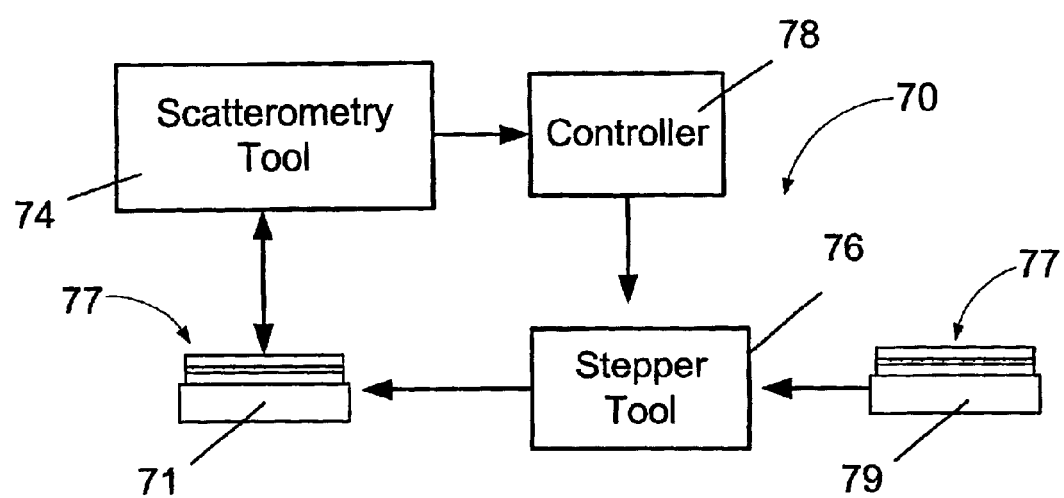
FIG. 6 depicts an illustrative embodiment of a system in accordance with one embodiment of the present invention.

An illustrative system 70 that may be used in one embodiment of the present invention is shown in FIG. 6. The system 70 is comprised of a scatterometry tool 74, a stepper tool 76, and a controller 78. As indicated in FIG. 6, the wafer 71 is representative of one or more wafers having a film stack 77 comprised of at least one process layer and a layer of photoresist 38 formed thereabove, that have previously been processed in the stepper tool 76. The layer of photoresist 38 on the wafer 71 was subjected to an exposure process in the stepper tool 76 to transfer the features defined in the reticle (not shown) to the layer of photoresist 38. During this process, the grating structures 60 were defined in the layer of photoresist 38, as were many other features that will be used to ultimately form corresponding features in the underlying process layer 36. Thereafter, a post-exposure bake process may be performed on the layer of photoresist 38. Ultimately, the layer of photoresist 38 will be subjected to a development process whereby soluble portions of the layer of photoresist 38 will be removed. This will result in the definition of a patterned layer of photoresist 38 that reflects the pattern in the reticle used during the exposure process. This patterned layer of photoresist 38 will be used in patterning the underlying process layer by performing one or more known etching processes. The layer of photoresist 38 may be formed in the "track" portion of a typical photolithography module by performing a spin-coating process. Prior to being subjected to an exposure process in the stepper tool 76, the layer of photoresist,38 will normally be subjected to a soft-bake process to drive off excessive solvents in the layer of photoresist 38.

A variety of scatterometry tools 74 may be used with the present invention, e.g., so-called type 2θ-systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 74 may be based upon a comparison of light intensity to wavelength (for white light, fixed angle type scatterometry tools) or a comparison of intensity to incident angle (for angle resolved systems that use a single light source).

The grating structures 60 may be positioned at various locations relative to the focal plane of the stepper exposure process. That is, the grating structures 60 may be formed during an exposure process wherein the focal plane is located at the ideal location of the focal plane (where photoresist features having acceptable DICD dimensions are formed), or it may be located either above or below this ideal location. Moreover, the tilt of the layer of photoresist 38 may also produce variations in the characteristics of the features comprising the grating structure 60.

As a result, the features in the layer of photoresist 38 that comprise the grating structure 60 will have varying characteristics or profiles, e.g. critical dimensions will be wider than anticipated, corners of features will be rounded, etc. The changes in the characteristics or profile of the grating structure 60 will cause a significant change in the optical characteristic trace for the grating structure 60. Thus, using Maxwell's equations, a unique optical characteristic trace may be calculated for each anticipated variation in the profile of a grating structure 60 that may be produced as a result of variations in the proper location of the focal plane and/or the tilt of the layer of photoresist 38. A library may be created for the optical characteristic traces corresponding to each such variation. The calculated optical characteristic traces for the grating structure 60 may be correlated to any desired feature of the grating structure 60, e.g., the depth 65 of the trenches 40, the sidewall angle 63, etc., that may reflect the final profile of the photoresist features, e.g., lines or trenches, comprising the grating structure 60.

The present invention may be employed to compare or match a measured or generated optical characteristic trace for a grating structure 60 formed in a layer of photoresist 38 to the library of such optical characteristic traces, each of which corresponds to a particular anticipated variation in the grating structure 60. That is, in this embodiment, the present invention involves using a scatterometry tool 74 to measure or generate an optical characteristic trace for one or more grating structures 60 formed in the layer of photoresist 38 within the exposure field 41. Thereafter, the scatterometry tool 74 (or another controller somewhere within the manufacturing operation, e.g., controller 78) then compares or matches the measured optical characteristic trace to one of the traces stored in the library. As a result of this match, the scatterometry tool 74 (or other controller) may provide output data indicating a variety of characteristics of the features comprising the grating structure 60. For example, the scatterometry tool 74 may provide output data indicating the degree of corner rounding of the photoresist features, or the critical dimension of such features.

By taking measurements of each of the grating structures 60 within the exposure field 41, the present invention may be used to determine if the exposure process is producing features in the layer of photoresist 38 that are unacceptable, e.g. producing photoresist features with rounded corners, producing undercut features in the underlying process layer 36, etc. Moreover, based upon the optical characteristic of the grating structures 60, the exposure process to be performed by the stepper tool on subsequently process wafers may be controlled or modified so as to produce photoresist features having acceptable DICD dimensions and profiles.

Figure 2:
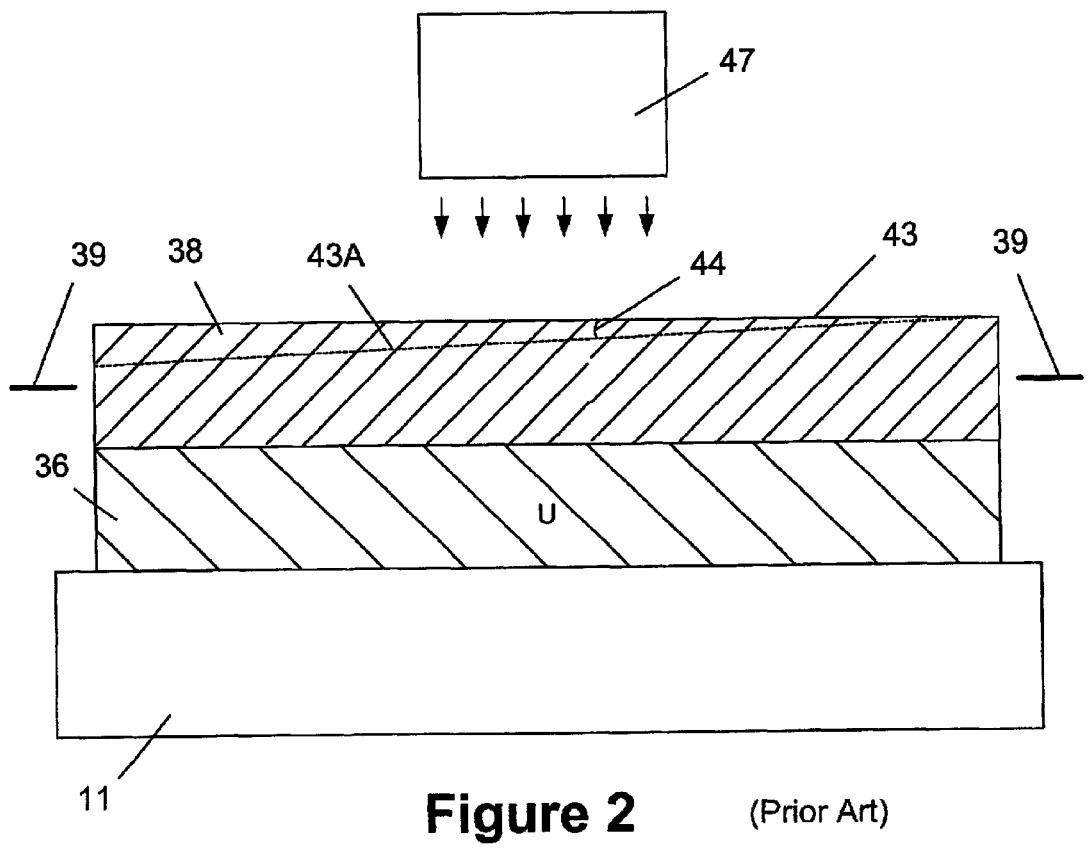
FIG. 2 is a cross-sectional view depicting an illustrative prior art wafer having a process layer and a layer of photoresist formed thereabove.
Figure 3:
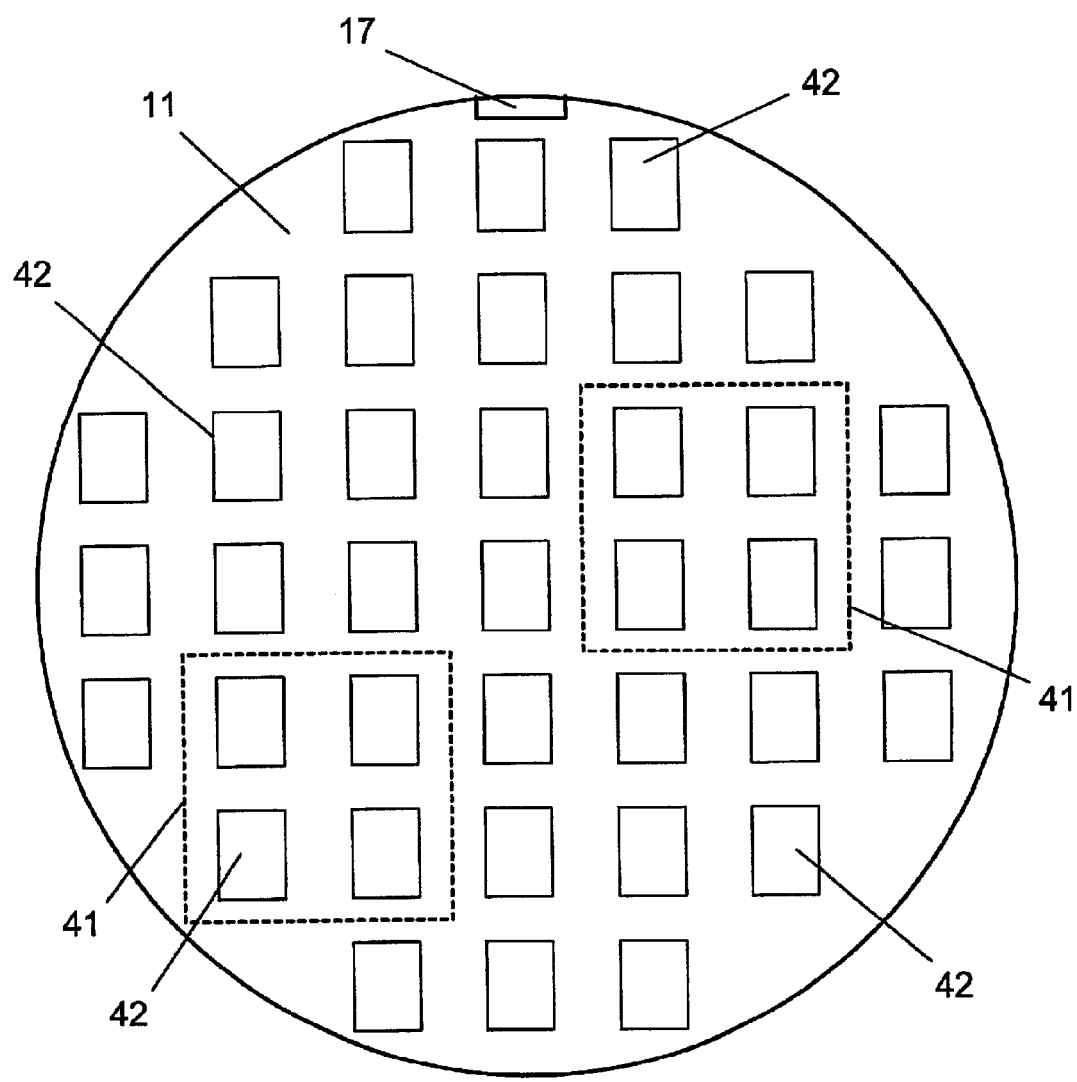
FIG. 3 is a plan view of an illustrative prior art wafer having a plurality of die formed thereabove.

For example, in the illustrative embodiment depicted in FIG. 4A, if the measured optical characteristic traces for the grating structures 60 at the bottom corners 61A, 61B of the exposure field 41 indicate that the grating structures 60 were exposed when the focal plane was positioned above the targeted location of the focal plane, i.e., line 39 in FIG. 2, the layer of photoresist 38 within the exposure field 41 tilts in a direction indicated by the arrow 45 shown in FIG. 4A. The magnitude of this tilt may also be determined based upon the matched or correlated trace from the library of optical characteristic traces for the grating structures 60. Moreover, analysis of the matched traces for the grating structures 60 at the bottom edge 50 of the exposure field 41 may indicate that the photoresist layer 38 within the exposure field 41 tilts in two directions. For example, matched traces may indicate that the grating structure 60 at the lower right corner 61B of the exposure field 41 may be lower than the grating structure 60 at the top edge 51 of the exposure field 41, and the grating structure 60 at the lower left corner 61A may be lower than the grating structure 60 on the right corner 61B. In this illustrative example, the layer of photoresist 38 within the exposure field 41 would tilt toward the bottom edge 50 of the exposure field 41 and toward the lower left corner 61A of the exposure field 41. The embodiments depicted in FIGS. 4B–C depict further refinements of the present invention wherein more grating structures 60 are applied within a given exposure field 41. As another example, the metrology data obtained by the scatterometry tool 74 may indicate that the surface 43 of the layer of photoresist 38 is positioned approximately normal to the incident light from the light source 47 of the stepper tool 74. However, the metrology data may also indicate that the layer of photoresist 38 was exposed when the focal plane was at some location, e.g., lower, than the targeted location of the focal plane.

Based upon a comparison of the measured or generated optical characteristic trace for a grating structure 60 formed in the layer of photoresist and an optical characteristic trace from the library, the controller 78 may determine or modify one or more parameters of an exposure process to be performed in the stepper tool 76 on a subsequently processed wafer. For example, the matching of the measured optical characteristic trace with one of the traces from the library may lead to the conclusion that the measured grating structure 60 is comprised of photoresist features having rounded corners of an unacceptable magnitude or degree. As a result, the controller 78 may modify one or more parameters of the stepper exposure process to be performed on subsequently processed wafers. For example, the subsequently processed wafers may be positioned closer to the light source of the stepper tool 76. In short, the controller 78 may analyze the scatterometry metrology data to determine how well the exposure process is performing in terms of producing photoresist features having desired DICD measurements and profiles. Moreover, if necessary, the controller 78 may modify one or more parameters of the exposure process, e.g., tilt, positioning of the wafer relative to a focal plane of the exposure process, etc., to compensate for the unacceptable variations in photoresist features.

In another embodiment, the present invention may be used to compare a measured optical characteristic trace of a grating structure 60 formed in the layer of photoresist to a target optical characteristic trace. The target trace may be calculated (using Maxwell's equations) for a grating structure 60 that corresponds to the production of photoresist features with acceptable DICD measurements and profiles. This target optical characteristic trace may be stored in the aforementioned library along with one or more additional traces, such as those described above. Based upon a comparison of the measured trace and the target trace, a relatively rough approximation of the quality of the process performed may be determined. That is, by comparing the measured trace to the target trace, it may be determined if the process is producing photoresist features having a profile sufficiently close to the ideal or acceptable profile such that further matching of the measured trace with an additional trace from the library is unwarranted. Using this technique, an initial determination may be made as to the acceptability of the process. Of course, this step may be performed in addition to the matching or correlating of a measured trace to a trace from the library as described above.

Moreover, based upon a comparison of the measured optical characteristic trace for the grating structure 60 and the target optical characteristic trace, the controller 78 may modify one or more parameters of the stepper exposure process on subsequently processed wafers 11. For example, if a comparison of the measured or generated trace with the target trace indicates that there is little or no deviation from the target optical characteristic trace for each of the structures 60, the controller 78 may then determine (or confirm) that the same exposure process may be performed on subsequently processed wafers. Alternatively, if the analysis indicates that there is a deviation between the target optical characteristic traces for the grating structures 60 and the measured optical characteristic traces for the grating structures 60, the controller 78 may then analyze the metrology data and modify one or more parameters of the exposure process, e.g., tilt, location of the focal plane, to compensate for the variation indicated by the optical metrology. For example, if the metrology data indicates that the layer of photoresist 38 was exposed with the focal plane located above the targeted focal plane, subsequently processed wafers may be raised such that the location of the focal plane of the exposure process performed on the subsequently processed wafers is closer to or matches the targeted location of the focal plane. As another example, the metrology data may indicate that the surface 43 of the layer of photoresist 38 is tilted at an angle, and the controller 78 may adjust the tilt of the reticle and/or the tilt of the wafer such that an exposure process performed on a subsequently processed wafer will compensate for the anticipated tilt in the surface 43 of the layer of photoresist 38 on the subsequently processed wafers.

The optical measurements of the grating structures 60 may be performed on any desired number of wafers and on any desired number of exposure fields 41 within a wafer. For example, such measurements may be performed on all exposure fields 41 on all wafers in one or more lots, or on a representative number of wafers in a given lot, and these results may then be used to determine or vary one or more parameters, e.g., location of the focal plane, tilt, etc., of the exposure process performed in the stepper tool 76 on subsequently processed wafers. Moreover, the measurements of the gratings 60 may be made after the layer of photoresist 38 has been subjected to a post-exposure bake process, or after it has been fully developed.

Control equations may be employed to adjust the operating recipe of the stepper tool 76 in situations where the methods described herein indicate that an adjustment is warranted. The control equations may be developed empirically using commonly known linear or non-linear techniques. The controller 78 may automatically control the operating recipes of the stepper tool 76 used to perform an exposure process on the subsequently processed wafers. Through use of the present invention, the extent and magnitude of variations in targeted DICD dimensions in a patterned layer of photoresist may be reduced.

In the illustrated embodiments, the controller 78 is a computer programmed with soft-ware to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the stepper tool 76 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to a method of using scatterometry measurements to control stepper process parameters. In one illustrative embodiment, the method comprises providing a library of optical characteristic traces, each of which corresponds to a grating structure 60 comprised of a plurality of features having a known profile, forming a plurality of grating structures 60 in a layer of photoresist 38, each of the formed grating structures 60 being comprised of a plurality of features having an unknown profile, and illuminating the formed grating structures 60. The method further comprises measuring light reflected off of each of the plurality of formed grating structures 60 to generate an optical characteristic trace for each of the formed grating structures, comparing each of the generated optical characteristic traces to at least one optical characteristic trace from the library, and modifying at least one parameter of a stepper exposure process to be performed on at least one subsequently processed wafer based upon the comparison of the generated optical characteristic traces and the at least one optical characteristic trace from the library.

In another illustrative embodiment, the method comprises providing a wafer 11 having at least one process layer 36 and a layer of photoresist 38 formed thereabove, forming a plurality of grating structures 60 in the layer of photoresist 38, illuminating the formed grating structures 60, and measuring light reflected off of the formed grating structures 60 to generate an optical characteristic trace for each of the formed grating structures 60. The method further comprises comparing the generated optical characteristic traces to a target optical characteristic trace, and determining, based upon a comparison of the generated optical characteristic traces and the target optical characteristic trace, at least one parameter of an exposure process to be performed on a layer of photoresist 38 formed on a subsequently processed wafer. In other embodiments of the invention, at least three, at least five or at least nine of the grating structures 60 are formed in a layer of photoresist 38. In yet another embodiment, the invention comprises modifying at least one parameter of a stepper exposure process to be performed on a subsequently processed wafer based upon a deviation between the generated optical characteristic traces and the target optical characteristic trace.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a library of optical characteristic traces, each of which corresponds to a grating structure comprised of a plurality of features having a known profile;
   forming a plurality of grating structures in a layer of photoresist, each of said formed grating structures being comprised of a plurality of features having an unknown profile;
   illuminating said formed grating structures;
   measuring light reflected off of each of said plurality of formed grating structures to generate an optical characteristic trace for each of said plurality of formed grating structures;
   comparing each of said generated optical characteristic traces to at least one optical characteristic trace from said library; and
   modifying at least one parameter of a stepper exposure process to be performed on at least one subsequently processed wafer based upon said comparison of said generated optical characteristic traces and said at least one optical characteristic trace from said library.

2. The method of claim 1, wherein said plurality of formed grating structures are formed within an area defined by a single exposure field of a stepper exposure process.

3. The method of claim 1, wherein forming a plurality of grating structures in a layer of photoresist comprises forming at least three grating structures in a layer of photoresist.

4. The method of claim 1, wherein forming a plurality of grating structures in a layer of photoresist comprises forming at least five grating structures in a layer of photoresist.

5. The method of claim 1, wherein forming a plurality of grating structures in a layer of photoresist comprises forming at least nine grating structures in a layer of photoresist.

6. The method of claim 1, wherein modifying at least one parameter of a stepper exposure process to be performed on at least one subsequently processed wafer comprises modifying at least one of a focal plane position, a tilt angle of a reticle, and a tilt angle of a wafer for at least one subsequently processed wafer.

7. The method of claim 1, wherein said formed grating structures are comprised of a plurality of lines or trenches.

8. The method of claim 1, wherein measuring light reflected off of said plurality of grating structures to generate an optical characteristic trace for each of said grating structures is performed after said layer of photoresist has been subjected to a post-exposure bake process and prior to said layer of photoresist being subjected to a development process.

9. The method of claim 1, wherein measuring light reflected off of said plurality of grating structures to generate an optical characteristic trace for each of said grating structures is performed after said layer of photoresist is subjected to a development process.

10. A method, comprising:
    providing a library of optical characteristic traces, each of which corresponds to a grating structure comprised of a plurality of features having a known profile;
    forming a plurality of grating structures in a layer of photoresist within an area defined by a single exposure field of a stepper exposure process, each of said formed grating structures being comprised of a plurality of features having an unknown profile;
    illuminating said formed grating structures;
    measuring light reflected off of each of said plurality of formed grating structures to generate an optical characteristic trace for each of said plurality of formed grating structures;
    comparing each of said generated optical characteristic traces to at least one optical characteristic trace from said library; and
    modifying at least one parameter of a stepper exposure process to be performed on at least one subsequently processed wafer based upon said comparison of said generated optical characteristic traces and said at least one optical characteristic trace from said library.

11. The method of claim 10, wherein forming a plurality of grating structures in a layer of photoresist comprises forming at least three grating structures in a layer of photoresist.

12. The method of claim 10, wherein forming a plurality of grating structures in a layer of photoresist comprises forming at least five grating structures in a layer of photoresist.

13. The method of claim 10, wherein forming a plurality of grating structures in a layer of photoresist comprises forming at least nine grating structures in a layer of photoresist.

14. The method of claim 10, wherein modifying at least one parameter of a stepper exposure process to be performed on at least one subsequently processed wafer comprises modifying at least one of a focal plane position, tilt angle of a reticle, and tilt angle of a wafer for at least one subsequently processed wafer.

15. The method of claim 10, wherein said formed grating structures are comprised of a plurality of lines or trenches.

16. The method of claim 10, wherein said exposure field is defined by a top edge, a bottom edge, a plurality of side edges and four corners.

17. The method of claim 16, wherein forming a plurality of grating structures in a layer of photoresist comprises forming at least three grating structures in a layer of photoresist, one of said grating structures being positioned proximate said top edge of said exposure field, and each of two of said grating structures being positioned adjacent a corner adjacent said bottom edge of said exposure field.

18. The method of claim 16, wherein forming a plurality of grating structures in a layer of photoresist comprises forming at least five grating structures in a layer of photoresist, one of said grating structures being positioned at approximately a middle of said exposure field, and each of four of said grating structures being positioned proximate a corner of said exposure field.

19. The method of claim 16, wherein forming a plurality of grating structures in a layer of photoresist comprises forming at least nine grating structures in a layer of photoresist, eight of said grating structures being positioned around a perimeter of said exposure field, and one of said grating structures being positioned at approximately a middle of said exposure field.

20. The method of claim 10, wherein measuring light reflected off of said plurality of grating structures to generate an optical characteristic trace for each of said grating structures is performed after said layer of photoresist has been subjected to a post-exposure bake process and prior to said layer of photoresist being subjected to a development process.

21. The method of claim 10, wherein measuring light reflected off of said plurality of grating structures to generate an optical characteristic trace for each of said grating structures is performed after said layer of photoresist is subjected to a development process.

22. A method, comprising:
providing a library of optical characteristic traces, each of which corresponds to a grating structure comprised of a plurality of features having a known profile;
forming at least three grating structures in a layer of photoresist within an area defined by a single exposure field of a stepper exposure process, each of said formed grating structures being comprised of a plurality of features having an unknown profile, said exposure field being defined by a top edge, a bottom edge, a plurality of side edges and four corners;
illuminating said formed grating structures;
measuring light reflected off of each of said at least three formed grating structures to generate an optical characteristic trace for each of said at least three formed grating structures;
comparing each of said generated optical characteristic traces to at least one optical characteristic trace from said library; and
modifying at least one parameter of a stepper exposure process to be performed on at least one subsequently processed wafer based upon said comparison of said generated optical characteristic traces and said at least one optical characteristic trace from said library.

23. The method of claim 22, wherein forming at least three grating structures in a layer of photoresist comprises forming at least five grating structures in a layer of photoresist.

24. The method of claim 22, wherein forming at least three grating structures in a layer of photoresist comprises forming at least nine grating structures in a layer of photoresist.

25. The method of claim 22, wherein modifying at least one parameter of a stepper exposure process to be performed on at least one subsequently processed wafer comprises modifying at least one of a focal plane position, tilt angle of a reticle, and tilt angle of a wafer for at least one subsequently processed wafer.

26. The method of claim 22, wherein said at least three formed grating structures are comprised of a plurality of lines or trenches.

27. The method of claim 22, wherein forming at least three grating structures in a layer of photoresist comprises forming at least three grating structures in a layer of photoresist, one of said grating structures being positioned proximate said top edge of said exposure field, and each of two of said grating structures being positioned adjacent a corner adjacent said bottom edge of said exposure field.

28. The method of claim 22, wherein forming at least three grating structures in a layer of photoresist comprises forming at least five grating structures in a layer of photoresist, one of said grating structures being positioned at approximately a middle of said exposure field, and each of four of said grating structures being positioned proximate a corner of said exposure field.

29. The method of claim 22, wherein forming at least three grating structures in a layer of photoresist comprises forming at least nine grating structures in a layer of photoresist, eight of said grating structures being positioned around a perimeter of said exposure field, and one of said grating structures being positioned at approximately a middle of said exposure field.

30. The method of claim 22, wherein measuring light reflected off of said at least three grating structures to generate an optical characteristic trace for each of said grating structures is performed after said layer of photoresist has been subjected to a post-exposure bake process and prior to said layer of photoresist being subjected to a development process.

31. The method of claim 22, wherein measuring light reflected off of said at least three grating structures to generate an optical characteristic trace for each of said grating structures is performed after said layer of photoresist is subjected to a development process.

32. A method, comprising:
providing a library of optical characteristic traces, each of which corresponds to a grating structure comprised of a plurality of features having a known profile;
forming at least four grating structures in a layer of photoresist within an area defined by a single exposure field of a stepper exposure process, each of said formed grating structures being comprised of a plurality of features having an unknown profile, said exposure field being defined by a top edge, a bottom edge, a plurality of side edges and four corners;
illuminating said formed grating structures;

measuring light reflected off of each of said at least four formed grating structures to generate an optical characteristic trace for each of said plurality of formed grating structures;

comparing each of said generated optical characteristic traces to at least one optical characteristic trace from said library; and modifying at least one parameter of a stepper exposure process to be performed on at least one subsequently processed wafer based upon said comparison of said generated optical characteristic traces and said at least one optical characteristic trace from said library.

33. The method of claim 32, wherein forming at least four grating structures in a layer of photoresist comprises forming at least five grating structures in a layer of photoresist.

34. The method of claim 32, wherein forming at least four grating structures in a layer of photoresist comprises forming at least nine grating structures in a layer of photoresist.

35. The method of claim 32, wherein modifying at least one parameter of a stepper exposure process to be performed on at least one subsequently processed wafer comprises modifying at least one of a focal plane position, a tilt angle of a reticle, and a tilt angle of a wafer for at least one subsequently processed wafer.

36. The method of claim 32, wherein said formed grating structures are comprised of a plurality of lines or trenches.

37. The method of claim 32, wherein each of said at least four grating structures are positioned proximate a corner of said exposure field.

38. The method of claim 32, wherein forming at least four grating structures in a layer of photoresist comprises forming at least five grating structures in a layer of photoresist, one of said grating structures being positioned at approximately a middle of said exposure field, and each of four of said grating structures being positioned proximate a corner of said exposure field.

39. The method of claim 32, wherein forming at least four grating structures in a layer of photoresist comprises forming at least nine grating structures in a layer of photoresist, eight of said grating structures being positioned around a perimeter of said exposure field, and one of said grating structures being positioned at approximately a middle of said exposure field.

40. The method of claim 32, wherein measuring light reflected off of said at least four grating structures to generate an optical characteristic trace for each of said grating structures is performed after said layer of photoresist has been subjected to a post-exposure bake process and prior to said layer of photoresist being subjected to a development process.

41. The method of claim 32, wherein measuring light reflected off of said at least four grating structures to generate an optical characteristic trace for each of said grating structures is performed after said layer of photoresist is subjected to a development process.

42. A method, comprising:

providing a library of optical characteristic traces, each of which corresponds to a grating structure comprised of a plurality of features having a known profile;

forming at least four grating structures in a layer of photoresist within an area defined by a single exposure field of a stepper exposure process, each of said formed grating structures being comprised of a plurality of features having an unknown profile, said exposure field being defined by a top edge, a bottom edge, a plurality of side edges and four corners, each of four of said grating structures being positioned proximate a corner of said exposure field;

illuminating said formed grating structures;

measuring light reflected off of each of said plurality of formed grating structures to generate an optical characteristic trace for each of said plurality of formed grating structures;

comparing each of said generated optical characteristic traces to at least one optical characteristic trace from said library; and modifying at least one parameter of a stepper exposure process to be performed on at least one subsequently processed wafer based upon said comparison of said generated optical characteristic traces and said at least one optical characteristic trace from said library.

43. The method of claim 42, wherein forming at least four grating structures in a layer of photoresist comprises forming at least nine grating structures in a layer of photoresist.

44. The method of claim 42, wherein modifying at least one parameter of a stepper exposure process to be performed on at least one subsequently processed wafer comprises modifying at least one of a focal plane position, a tilt angle of a reticle, and a tilt angle of a wafer for at least one subsequently processed wafer.

45. The method of claim 42, wherein said formed grating structures are comprised of a plurality of lines or trenches.

46. The method of claim 42, further comprising forming at least five additional grating structures in said layer of photoresist within said single exposure field, each of four of said at least five additional grating structures being positioned proximate a middle of at least one of said top edge, said bottom edge and said plurality of side edges of said exposure field, and one of said at least five additional grating structures being positioned proximate a middle of said exposure field.

47. The method of claim 42, wherein measuring light reflected off of said at least four grating structures to generate an optical characteristic trace for each of said grating structures is performed after said layer of photoresist has been subjected to a post-exposure bake process and prior to said layer of photoresist being subjected to a development process.

48. The method of claim 42, wherein measuring light reflected off of said at least four grating structures to generate an optical characteristic trace for each of said grating structures is performed after said layer of photoresist is subjected to a development process.

49. A method, comprising:

providing a wafer having at least one process layer and a layer of photoresist formed thereabove;

forming a plurality of grating structures in said layer of photoresist;

illuminating said formed grating structures;

measuring light reflected off of said formed grating structures to generate an optical characteristic trace for each of said formed grating structures;

comparing the generated optical characteristic trace for each of said formed grating structures to a target optical characteristic trace; and determining, based upon a comparison of said generated optical characteristic trace and said target optical characteristic trace, at least one parameter of an exposure process to be performed on a layer of photoresist formed above a subsequently processed wafer.

50. The method of claim 49, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

51. The method of claim 49, wherein forming a plurality of grating structures in said layer of photoresist comprises forming at least three grating structures in said layer of photoresist within an area defined by a single exposure field of a stepper exposure process.

52. The method of claim 49, wherein forming a plurality of grating structures in said layer of photoresist comprises performing an exposure process in a stepper tool to form a plurality of grating structures in said layer of photoresist.

53. The method of claim 49, wherein forming a plurality of grating structures in said layer of photoresist comprises forming at least three grating structures in said layer of photoresist.

54. The method of claim 49, wherein forming a plurality of grating structures in said layer of photoresist comprises forming at least five grating structures in said layer of photoresist.

55. The method of claim 49, wherein forming a plurality of grating structures in said layer of photoresist comprises forming at least nine grating structures in said layer of photoresist.

56. The method of claim 49, wherein forming a plurality of grating structures in said layer of photoresist comprises forming at least three grating structures in said layer of photoresist within an area defined by a single exposure field of a stepper exposure process, said exposure field being defined by a top edge, a bottom edge, a plurality of side edges and four corners, at least two of said grating structures being formed in separate corners of said exposure field.

57. The method of claim 49, wherein forming a plurality of grating structures in said layer of photoresist comprises forming at least three grating structures in said layer of photoresist within an area defined by a single exposure field of a stepper exposure process, said exposure field being defined by a top edge, a bottom edge, a plurality of side edges and four corners, each of at least two of said grating structures being formed adjacent one of said corners proximate said bottom edge of said exposure field, and at least one of said grating structures being formed adjacent said top edge of said exposure field.

58. The method of claim 49, wherein forming a plurality of grating structures in said layer of photoresist comprises forming at least four grating structures in said layer of photoresist within an area defined by a single exposure field of a stepper exposure process, said exposure field being defined by a top edge, a bottom edge, a plurality of side edges and four corners, each of said grating structures being formed adjacent one of said corners of said exposure field.

59. The method of claim 49, wherein forming a plurality of grating structures in said layer of photoresist comprises forming at least five grating structures in said layer of photoresist within an area defined by a single exposure field of a stepper exposure process, said exposure field being defined by a top edge, a bottom edge, a plurality of side edges and four corners, each of four of said grating structures being formed adjacent one of said corners of said exposure field, and at least one of said grating structures being formed proximate a middle of said exposure field.

60. The method of claim 49, wherein forming a plurality of grating structures in said layer of photoresist comprises forming at least nine grating structures in said layer of photoresist within an area defined by a single exposure field of a stepper exposure process, said exposure field being defined by a top edge, a bottom edge, a plurality of side edges and four corners, at least three of said grating structures being formed proximate each of said top edge, bottom edge and plurality of side edges of said exposure field.

61. The method of claim 49, wherein measuring light reflected off of said plurality of grating structures to generate an optical characteristic trace for each of said grating structures is performed after said layer of photoresist has been subjected to a post-exposure bake process and prior to said layer of photoresist being subjected to a development process.

62. The method of claim 49, wherein measuring light reflected off of said plurality of grating structures to generate an optical characteristic trace for each of said grating structures is performed after said layer of photoresist is subjected to a development process.

63. The method of claim 49, further comprising modifying, based upon a comparison of said generated optical characteristic traces and said target optical characteristic trace, at least one parameter of an exposure process to be performed on a layer of photoresist formed on a subsequently processed wafer.

64. The method of claim 49, wherein said at least one parameter of said exposure process is comprised of at least one of a location of a focal plane position, a tilt angle of a reticle and a tilt angle of a wafer for at least one subsequently processed wafer.

65. The method of claim 49, wherein measuring the reflected light comprises measuring the intensity of the reflected light.

66. A method, comprising:
providing a wafer having at least one process layer and a layer of photoresist formed thereabove;
forming at least three grating structures in said layer of photoresist within an area defined by a single exposure field of a stepper exposure process, said exposure field being defined by a top edge, a bottom edge, a plurality of side edges and four corners;
illuminating said formed grating structures;
measuring light reflected off of said formed grating structures to generate an optical characteristic trace for each of said formed grating structures;
comparing the generated optical characteristic trace for each of said grating structures to a target optical characteristic trace; and
modifying, based upon a comparison of said generated optical characteristic traces and said target optical characteristic trace, at least one parameter of an exposure process to be performed on a layer of photoresist formed on a subsequently processed wafer.

67. The method of claim 66, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

68. The method of claim 66, wherein forming at least three grating structures in said layer of photoresist comprises performing an exposure process in a stepper tool to form at least three grating structures in said layer of photoresist.

69. The method of claim 66, wherein forming at least three grating structures in said layer of photoresist comprises forming at least five grating structures in said layer of photoresist.

70. The method of claim 66, wherein forming at least three grating structures in said layer of photoresist comprises forming at least nine grating structures in said layer of photoresist.

71. The method of claim 66, wherein each of at least two of said grating structures are formed adjacent one of said corners proximate said bottom edge of said exposure field, and at least one of said grating structures is formed adjacent said top edge of said exposure field.

72. The method of claim 66, wherein forming at least three grating structures in said layer of photoresist comprises forming at least four grating structures in said layer of photoresist, each of said grating structures being formed adjacent one of said corners of said exposure field.

73. The method of claim 66, wherein forming at least three grating structures in said layer of photoresist comprises forming at least five grating structures in said layer of photoresist, each of four of said grating structures being formed adjacent one of said corners of said exposure field, and at least one of said grating structures being formed proximate a middle of said exposure field.

74. The method of claim 66, wherein forming at least three grating structures in said layer of photoresist comprises forming at least nine grating structures in said layer of photoresist, at least three of said grating structures being formed proximate each of said top edge, bottom edge and plurality of side edges of said exposure field.

75. The method of claim 66, wherein measuring light reflected off of said formed structures to generate an optical characteristic trace for each of said grating structures is performed after said layer of photoresist has been subjected to a post-exposure bake process and prior to said layer of photoresist being subjected to a development process.

76. The method of claim 66, wherein measuring light reflected off of said formed grating structures to generate an optical characteristic trace for each of said grating structures is performed after said layer of photoresist is subjected to a development process.

77. The method of claim 66, wherein said at least one parameter of said exposure process is comprised of at least one of a location of a focal plane position, a tilt angle of a reticle and a tilt angle of a wafer for at least one subsequently processed wafer.

78. The method of claim 66, wherein measuring the reflected light comprises measuring the intensity of the reflected light.

79. A method, comprising:
  providing a wafer having at least one process layer and a layer of photoresist formed thereabove;
  forming at least four grating structures in said layer of photoresist within an area defined by a single exposure field of a stepper exposure process, said exposure field being defined by a top edge, a bottom edge, a plurality of side edges and four corners, each of said grating structures being formed adjacent one of said corners of said exposure field;
  illuminating said formed grating structures;
  measuring light reflected off of said formed grating structures to generate an optical characteristic trace for each of said formed grating structures;
  comparing the generated optical characteristic trace for each of said grating structures to a target optical characteristic trace; and
  modifying, based upon a comparison of said generated optical characteristic traces and said target optical characteristic trace, at least one parameter of an exposure process to be performed on a layer of photoresist formed on a subsequently processed wafer.

80. The method of claim 79, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

81. The method of claim 79, wherein forming at least four grating structures in said layer of photoresist comprises performing an exposure process in a stepper tool to form at least four grating structures in said layer of photoresist.

82. The method of claim 79, wherein forming at least four grating structures in said layer of photoresist comprises forming at least five grating structures in said layer of photoresist.

83. The method of claim 79, wherein forming at least four grating structures in said layer of photoresist comprises forming at least nine grating structures in said layer of photoresist.

84. The method of claim 79, further comprising forming an additional grating structure in said layer of photoresist proximate a middle of said exposure field.

85. The method of claim 79, wherein forming at least four grating structures in said layer of photoresist comprises forming at least nine grating structures in said layer of photoresist, at least three of said grating structures being formed proximate each of said top edge, bottom edge and plurality of side edges of said exposure field.

86. The method of claim 79, wherein measuring light reflected off of said formed grating structures to generate an optical characteristic trace for each of said grating structures is performed after said layer of photoresist has been subjected to a post-exposure bake process and prior to said layer of photoresist being subjected to a development process.

87. The method of claim 79, wherein measuring light reflected off of said plurality of grating structures to generate an optical characteristic trace for each of said grating structures is performed after said layer of photoresist is subjected to a development process.

88. The method of claim 79, wherein said at least one parameter of said exposure process is comprised of at least one of a location of a focal plane position, a tilt angle of a reticle and a tilt angle of a wafer for at least one subsequently processed wafer.

89. The method of claim 79, wherein measuring the reflected light comprises measuring the intensity of the reflected light.

90. A method, comprising:
  providing a wafer having at least one process layer and a layer of photoresist formed thereabove;
  forming at least four grating structures in said layer of photoresist within an area defined by a single exposure field of a stepper exposure process, said exposure field being defined by a top edge, a bottom edge, a plurality of side edges and four corners;
  illuminating said formed grating structures, each of said grating structures being formed adjacent one of said corners of said exposure field, and at least one of said grating structures being formed proximate a middle of said exposure field;
  measuring light reflected off of said formed grating structures to generate an optical characteristic trace for each of said formed grating structures;
  comparing the generated optical characteristic trace for each of said grating structures to a target optical characteristic trace; and
  modifying, based upon a comparison of said generated optical characteristic traces and said target optical characteristic trace, at least one parameter of an exposure process to be performed on a layer of photoresist formed on a subsequently processed wafer.

91. The method of claim 90, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

92. The method of claim 90, wherein forming at least four grating structures in said layer of photoresist comprises performing an exposure process in a stepper tool to form at least five grating structures in said layer of photoresist.

93. The method of claim 90, wherein forming at least five grating structures in said layer of photoresist comprises forming at least nine grating structures in said layer of photoresist.

94. The method of claim 90, wherein forming at least five grating structures in said layer of photoresist comprises forming at least nine grating structures in said layer of photoresist, at least three of said grating structures being formed proximate each of said top edge, bottom edge and plurality of side edges of said exposure field.

95. The method of claim 90, wherein measuring light reflected off of said formed grating structures to generate an optical characteristic trace for each of said formed grating structures is performed after said layer of photoresist has been subjected to a post-exposure bake process and prior to said layer of photoresist being subjected to a development process.

96. The method of claim 90, wherein measuring light reflected off of said formed grating structures to generate an optical characteristic trace for each of said formed grating structures is performed after said layer of photoresist is subjected to a development process.

97. The method of claim 90, wherein said at least one parameter of said exposure process is comprised of at least one of a location of a focal plane position, a tilt angle of a reticle and a tilt angle of a wafer for at least one subsequently processed wafer.

98. The method of claim 90, wherein measuring the reflected light comprises measuring the intensity of the reflected light.

* * * * *